(12) United States Patent
Zampetti et al.

(10) Patent No.: US 6,765,424 B2
(45) Date of Patent: Jul. 20, 2004

(54) STRATUM CLOCK STATE MACHINE MULTIPLEXER SWITCHING

(75) Inventors: George Zampetti, Livermore, CA (US); Bob Hamilton, Sunnyvale, CA (US)

(73) Assignee: Symmetricom, Inc., San Jose, CA (US)

( * ) Notice: Subject to any disclaimer, the term of this patent is extended or adjusted under 35 U.S.C. 154(b) by 51 days.

(21) Appl. No.: 09/989,315

(22) Filed: Nov. 20, 2001

(65) Prior Publication Data

US 2003/0094982 A1 May 22, 2003

(51) Int. Cl.[7] .............................. G06F 1/04; H04J 3/06
(52) U.S. Cl. ..................... 327/292; 370/503; 375/356
(58) Field of Search ................... 327/291–294, 327/144, 155, 99, 407; 375/356, 373, 357; 370/516–519, 503, 219

(56) References Cited

U.S. PATENT DOCUMENTS

| | | | |
|---|---|---|---|
| 4,914,404 A | | 4/1990 | Ernst .......................... 331/11 |
| 5,638,410 A | | 6/1997 | Kuddes ..................... 375/357 |
| 5,748,569 A | * | 5/1998 | Teodorescu et al. ........ 368/118 |
| 6,078,595 A | | 6/2000 | Jones et al. ................. 370/503 |
| 6,282,210 B1 | * | 8/2001 | Rapport et al. ............. 370/518 |
| 6,341,149 B1 | * | 1/2002 | Bertacchini et al. ........ 375/356 |

* cited by examiner

*Primary Examiner*—Minh Nguyen
(74) *Attorney, Agent, or Firm*—Gray, Cary, Ware & Freidenrich, LLP (57) ABSTRACT

Methods include receiving a pair of input clock signals; utilizing a stratum clock state machine to control a multiplexer; utilizing the multiplexer to switch an input of a main clock between each of the pair of input clock signals; inducing a phase build-out activity; and transmitting an output clock signal.

17 Claims, 6 Drawing Sheets

STRATUM CLOCK STATE MACHINE MULTIPLEXER SWITCHING

BACKGROUND OF THE INVENTION

1. Field of the Invention

The invention relates generally to the field of communication systems. More particularly, the invention relates to synchronization of communication systems. Specifically, a preferred implementation of the invention relates to a cascaded digital phase locked loop (PLL) based clock design.

2. Discussion of the Related Art

In telecommunications, there has always been a need to provide a distributed synchronization infrastructure to ensure the each node of the network operates within a controlled frequency tolerance. For example, prior to the use of digital communications, Frequency Division Multiple Access (FDMA) systems were used to gain efficient use of the communications channels between nodes. In these FDMA systems, voice channels are aggregated together in to a contiguous group of frequencies and assigned a particular channel frequency for transport. To prevent interference as groups from various originating nodes are multiplexed together, it is critical that channel assignments have tightly controlled frequency tolerance. Thus, each node must be provided with synchronization to control its frequency error. FDMA based systems have been replaced to a large extent by digital time division systems, but FDMA continues to be employed in mobile systems, and increasingly in wave division fiber optical systems.

Time Division Multiple Access (TDMA) digital communications systems have replaced FDMA as the current backbone for telecommunications. In these systems, a particular user's traffic is assigned a given timeslot that repeats at a given rate. The resulting traffic is a fixed bit rate determined by the originating node. To prevent data corruption problems the average rate of all channels should be the same for all nodes. Small discrepancies can be managed at a switching node by producing slips in the data. A slip is either a deletion or repetition of a group of bits to force rate equality. For example, if a switch clock is running fast with respect to an incoming user channel, then the outgoing line will have occasional duplications of data (typically bytes) to fill in the timing gaps.

To control the slip rates of services, multiple standards organizations have established both interface and functional synchronization standards. One key aspect of these standards is the use of various levels or strata of clocks. The stratification of clocks is used in conjunction with constraints on distribution topologies. For example, in North America, four basic stratum levels have been established for clocks. A stratum 1 clock is the highest performance clock and a stratum 4 is the lowest performance clock. There is a vast difference in both cost and performance encompassed in the stratum levels. In general, the stratum levels are loosely aligned with technology breakpoints for oscillators. A stratum clock's required functions encompass a number of factors beyond the performance of the local oscillator itself, but oscillator technology should be the dominant cost/performance driver in a well-designed stratum clock. Thus, stratum 1 requires the use of a primary atomic clock such a cesium tube standard to provide better than $1*10^{-11}$ autonomous accuracy. There is also the option to use a primary reference clock (PRC) in place of a stratum 1 clock. This equipment receives an external radio based precise timing source such as GPS or LORAN-C to discipline a non-stratum 1 oscillator to effectively performed at a verified stratum 1 level. A PRC must meet stringent performance requirements such as Telcordia GR-2830. Moving down the stratum levels, secondary atomic clocks such as rubidium cells and high performance Oven Controlled Crystal Oscillators (OCXO) such as SC cut double ovens may be used in stratum 2 clocks. Lower cost single oven AT cut OCXOs and non oven based Temperature Compensated Crystal Oscillators (TCXOs) can be employed in stratum 3 and stratum 4 based clocks.

To achieve a cost effective synchronization infrastructure, it is highly desirable to utilize lower level stratum 3 and 4 clocks as embedded clocks in telecommunication systems. Unfortunately, these lower level clocks are much more vulnerable to external influences which can degrade performance.

Near et al.[1] (Method for Synchronizing Interconnected Digital Equipment, U.S. Pat. No. 5,068,877) teaches that lower level stratum clocks can produce significant time error residuals and even propagate transmission errors as a result of normal daily transmission error activities on a synchronization reference input. The core problem underlying accumulated time error residuals is that frequency rather than time is distributed in networks. The delay in the path is not known. If as a result of a transmission error burst, a receive stratum clock switches to a backup reference, there is always some uncertainly as to the new phase position to establish. This effect is aggravated by phase noise on the reference and the local oscillator, as well as measurement resolution. A similar effect can be produced by a change in the effective path even without an active switch of a reference. These transient errors are classified as either rearrangement or phase build-out transients.

The problem of propagated transmission errors is related to the slew rate and amplitude of an individual phase transient event. In higher speed digital system, the high frequency content of the phase transient is sufficient to corrupt the eye pattern and generate transmission errors. Since all outgoing transmission links can be impacted, this error mechanism can result in an overall error multiplication. Therefore, an emerging need for improved transient management is in conjunction with high speed digital systems. Another emerging need for improved transient management is in conjunction with the use of network inputs for wireless applications to generate low phase noise high frequency carriers.

These phase transient problems are typically managed in two ways. The first tool used in managing transients is that functional standards have been established, such as Telcordia GR1244[3], to set limits on these transients. However, the limits are lax, to reduce the cost impact on embedded clocks. The second tool used in managing transients is in utilizing an optimized synchronization distribution network design such as disclosed in Near et al.[1] While careful attention to network design can reduce the overall degradation level, a more significant improvement can be afforded by designing low cost stratum clocks with significantly reduced transient errors.

Current methodologies for phase build-out can be categorized as either phase jamming or phase averaging approaches. The most simple form of phase build-out is a phase jamming technique. In phase jamming, typically the local oscillator divider is jammed to the same count value as the input reference divider, which, in principle, can align the two input signals to the phase detector to within one local oscillator clock period. Although this is a common technique used in clock design, it has severe limitations. Since the jam is performed synchronously with an input reference edge, the residual phase bias is completely dependent on incoming high frequency phase noise (termed jitter). Since peak-to-peak input jitter can be an order of magnitude greater than the required maximum phase transient, the phase jamming does not ensure compliance to standards and can produce severe transient problems.

To counter-act some of the limitation of phase jamming, phase averaging approaches can be employed. Wolf[2] (Clock Generator and Synchronizing Method, U.S. Pat. No. 6,181,175) teaches a phase averaging technique. The basic premise is that after an abnormal phase step is detected, the phase locked loop (PLL) update can be temporarily suspended. During this suspension period, an average of the phase error can be obtained. This average phase error can subsequently be used as compensation during locked operation of the PLL by subtracting this bias from all input phase error measurements.

This method of averaging does reduce the impact of input phase jitter on measuring and attempts to minimize the impact of an input phase transient. However, it has several significant limitations.

First, the approach used to detect an input transient does not include any explicit method to filter jitter. Without suppression of jitter, the detection mechanism is subject to errors. If the detection threshold is set too low, then normal network jitter can produce spurious phase step corrections. This activity will produce both a random walk phase noise and a residual frequency bias. On the other hand, if the threshold is set high to eliminate spurious corrections, then the actual input phase steps will go undetected.

Second, the method requires suspension of the update of the control loop while the phase average is being determined. During the suspension of the control loop update, the local oscillator is free to drift from the optimal phase position. The phase error accumulate during the suspension period is not compensated and is a source of both random walk phase noise and residual frequency bias. The suspension problem is most notable during input reference re-arrangement. If the phase build-out methodology provides for a continuous filtered measurements of multiple input references, then a reference switch can be performed with instantaneous phase build-out.

Heretofore, the requirements of providing a clock designed to perform phase-build-out without the limitations of the existing methods referred to above has not been fully met. What is needed is a solution that addresses these requirements.

SUMMARY OF THE INVENTION

There is a need for the following embodiments. Of course, the invention is not limited to these embodiments.

According to a first aspect of the invention, a method comprises: receiving a pair of input clock signals; utilizing a stratum clock state machine to control a multiplexer; utilizing the multiplexer to switch an input of a main clock between each of the pair of input clock signals; inducing a phase build-out activity; and transmitting an output clock signal. According to a second aspect of the invention, an apparatus comprises: a first input clock digital phase-locked loop; a second input clock digital phase-locked loop; a stratum clock state machine coupled to the first input clock digital phase-locked loop and to the second input clock digital phase-locked loop; and a main clock phase-locked loop coupled to the first input clock digital phase-locked loop, to the second input clock digital phase-locked and to the stratum clock state machine.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings. The invention may be better understood by reference to one or more of these drawings in combination with the description presented herein. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description. Descriptions of well known components and processing techniques are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this detailed description.

Within this application several publications are referenced by Arabic numerals within brackets. Full citations for these, and other, publications may be found at the end of the specification immediately preceding the claims after the section heading References. The disclosures of all these publications in their entireties are hereby expressly incorporated by reference herein for the purpose of indicating the background of the invention and illustrating the state of the art.

The below-referenced U.S. patents disclose embodiments that were satisfactory for the purposes for which they are intended. The entire contents of U.S. Pat. Nos. 5,068,877 and 6,181,175 are hereby expressly incorporated by reference herein for all purposes.

It is an objective of the invention to provide a core synchronization module designed to perform phase-build-out without the limitations of the prior art. In one embodiment, this phase build-out objective can be achieved as part of an overall integrated digital clock design that can be implemented as a single Field-Programmable Gate Array (FPGA) or Application Specific Integrated Circuit (ASIC). Another objective of the invention is to act as a firewall, from a synchronization perspective, eliminating all of the transience and noise which may be in a signal path, recovering some traceability.

The invention can include a two-to-one cascaded clock configuration which can be part of a central office clock. The invention can include an integrated core synchronization module, or an integrated clock, that is part of a single chip (e.g., a very large scale integrated circuit). Thus, the invention can be embedded inside a receiving network element which is required by standards to have a stratum clock of some level.

A very important feature of the invention is that it can be designed to be scalable. The invention can include a flexible building block. By changing some external components the synthesizer can fulfill different stratum clock standards. More specifically, by improving the stability of the external oscillator, a stratum 3E clock or a stratum 2 clock design may be achieved. Particularly, the invention can transition among different stratum clocks because the phase-build out mechanism is inherent to the system.

Figure 1:
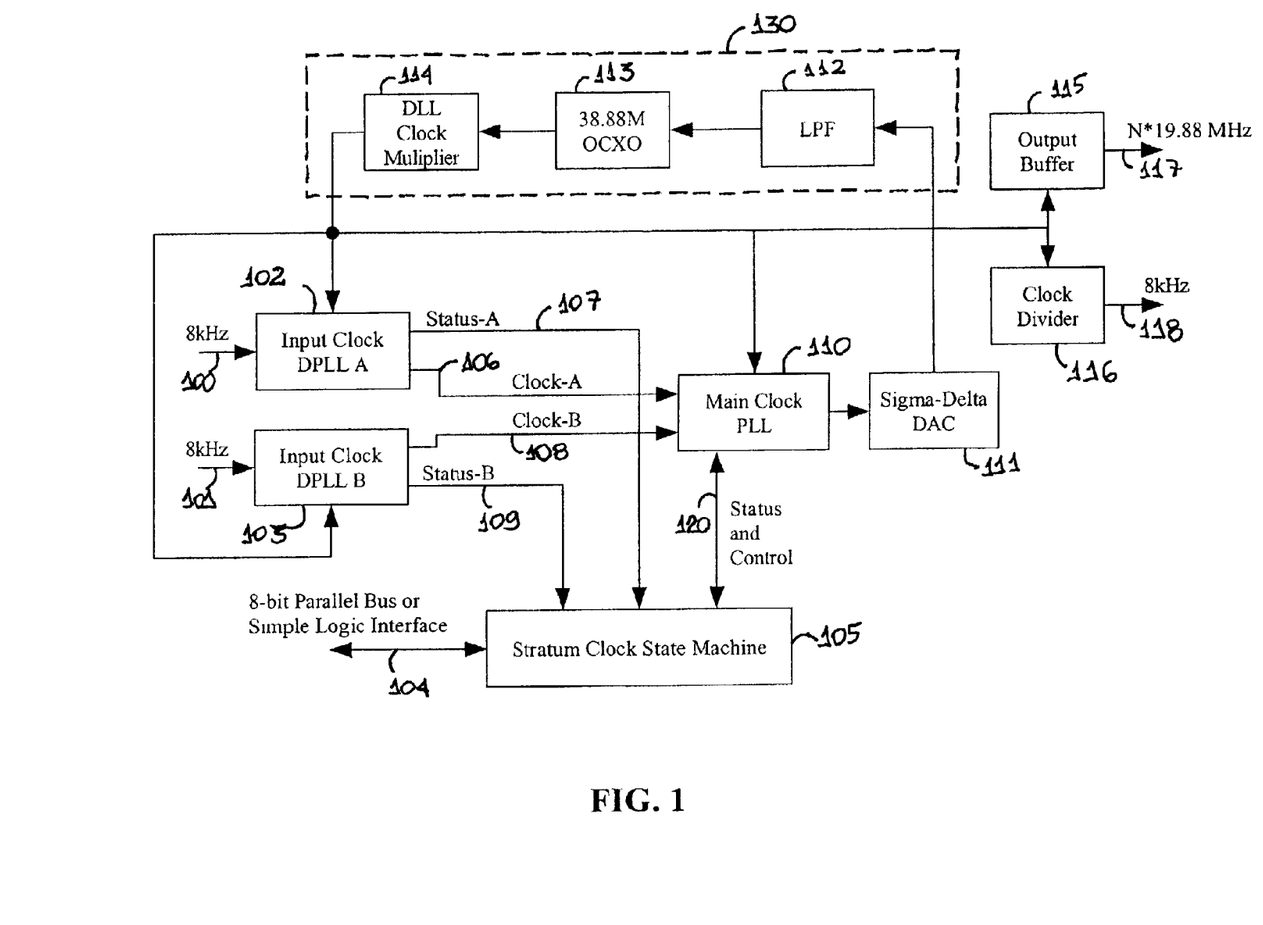
FIG. 1 illustrates a block diagram of a basic stratum 3 core sync module, representing an embodiment of the invention.

Referring to FIG. 1, a block diagram of a basic stratum 3 core sync module is depicted. An 8 kHz input line A 100 is coupled to a digital phase-locked loop input clock A 102. An 8 kHz input line B 101 is coupled to a digital phase-locked loop input clock B 103. The digital phase-locked loop input clock A 102 is coupled to a clock-A line 106 and to a status-A line 107. The digital phase-locked loop input clock B 103 is coupled to a clock-B line 108 and a status-B line 109. The status-A line 107 and the status-B line 109 are coupled to a stratum clock state machine 105. The clock-A line 106 and the clock-B line 108 are coupled to a phase-locked loop main clock 110. The phase-locked loop main clock 110 and the stratum clock state machine 105 are coupled together via a status and control connect 120. An 8-bit parallel bus or logic interface 104 is coupled to the stratum clock state machine 105.

Still referring to FIG. 1, the phase-locked loop main clock 110 is coupled to a low-pass filter 112 via a sigma-delta DAC 111. The low-pass filter 112 is coupled to a 38.88 MHz oven controlled crystal oscillator 113. The 38.88 MHz oven controlled crystal oscillator 113 is coupled to a delay-locked loop clock multiplier 114. The delay-locked loop clock multiplier 114 is coupled to: (i) the main clock 110; (ii) to the digital phase-locked loop input clock A 102; (iii) to the digital phase-locked loop input clock B 103; (iv) to a clock buffer 115; and (v) to an output divider 116. The clock buffer 115 is coupled to an N*19.88 MHz output line 117. The output divider 116 is coupled to an 8 kHz line 118. A dashed box 130 includes all elements that may be external to a clock core.

Referring to FIG. 1, a varactor based approach involves correcting the 38.88 MHz oven controlled crystal oscillator 113 by physically steering it. The phase-locked loop main clock 110 sends digital words to the sigma delta DAC 111, and an analog output signal leaving the sigma-delta DAC 111 is filtered via the low-pass filter 112, and effectively drives the oven controlled crystal oscillator 113. The output of the 38.88 MHz oven controlled crystal oscillator 113 serves as input to the delay-locked loop clock multiplier 114. The output of the delay-locked loop clock multiplier 114 is simultaneously fed to the digital phase-locked loop input clock A 102, and to the output of the module, comprising the clock buffer 115 and the output divider 116. The delay-locked loop clock multiplier 114 can multiply its input signal by an integer number, typically 2 or 4.

Still referring to FIG. 1, the main clock PLL 110 includes a structure that maintains the history of a series of integral control word, and is communicated between the stratum clock state machine 105 and the main clock PLL 110. There are two components of the control word: proportional and integral. The one that maintains the frequency information can be thought of as the integral controller. The main clock PLL 110 maintains that history. If there is a loss of input, the stratum clock state machine 105 can command the main clock PLL 110 to use the historical controller, preventing transience from affecting the main clock PLL 110 at the moment it goes on the holdover. Instead of using the instantaneous state of the system, the core can utilize a set of historical frequencies that has been stored before the transient, improving the overall performance of the clock core.

Referring to FIG. 1, the digital input phase-locked loop A 102 and the digital input phase-locked loop B 103 can include all typical digital phase-locked loop component blocks, and also feature a state monitoring mechanism to determine what types of transients are occurring at the input. These states are fed into the stratum clock state machine 105 for processing.

Still referring to FIG. 1, the stratum clock state machine 105 processes and manages the loops to help eliminate input transients and to induce the phase built-out activities. The pair of digital phase-locked loops input clocks 102,103 is monitored by the stratum clock state machine 105. Based on the contents of the status-A line 107, the status-B line 109, or on a command coming through the 8-bit parallel bus 104, the stratum clock state machine can control the phase-locked loop main clock 110 and its inputs. At some point, it may be desirable to switch between inputs coming from the digital phase-locked loop input clocks A 102, and from the digital phase-locked loop input clock B 103. This switching may be required for several reasons, including autonomous detection, loss of signal on one of the inputs, maintenance issues, and user management utilizing the 8-bit parallel bus 104.

Referring to FIG. 1, a pair of optional phase build-out lines may be fed from the stratum clock state machine 105 into the digital phase-locked loop input clock A and the digital phase-locked loop input clock B for coarse phase adjustments. These adjustments can be controlled with the stratum clock state machine 105. Also, the stratum clock state machine 105 can make decision to temporarily freeze the input to the phase-locked loop main clock 110.

Figure 2:
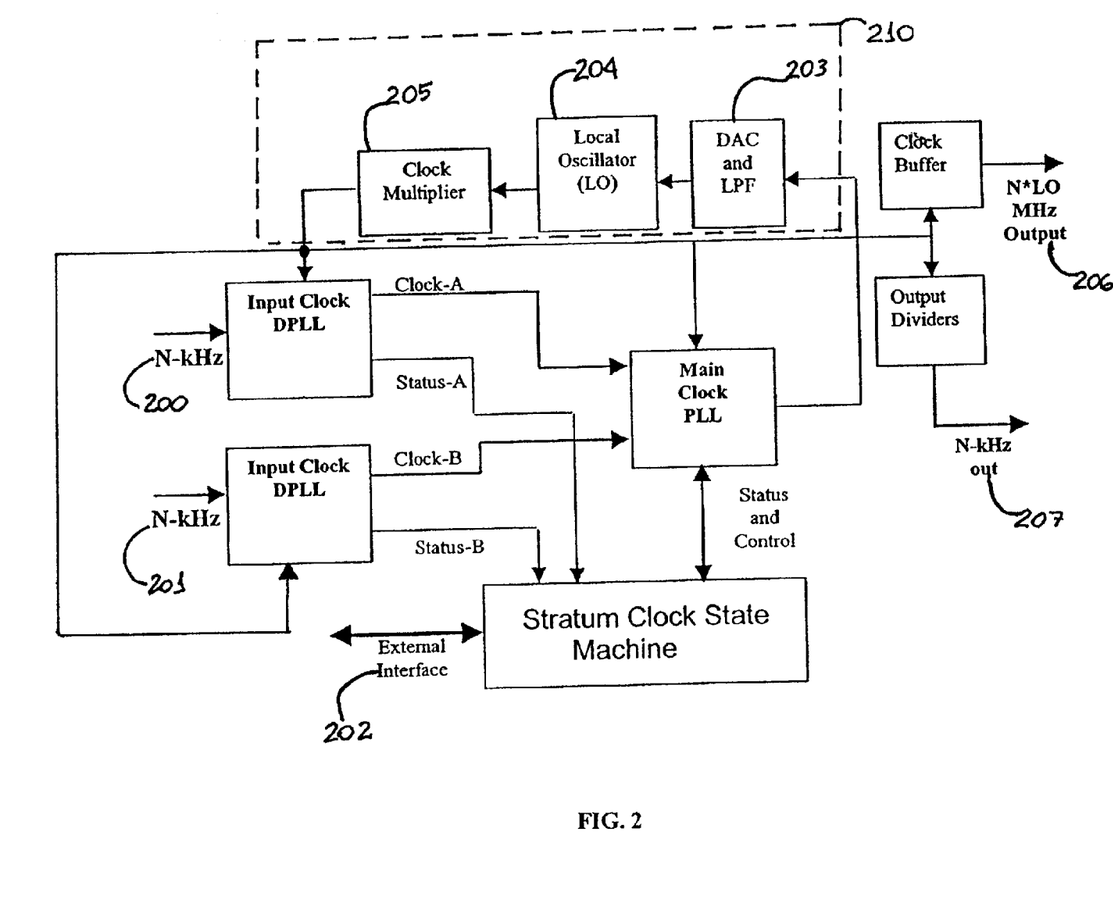
FIG. 2 illustrates a block diagram of a generalized varactor based cascaded digital PLL clock, representing an embodiment of the invention.

Referring to FIG. 2, a block diagram of a generalized varactor based cascaded digital PLL clock is depicted. A pair N-kHz signals 200, 201 serves as input to the synchronization module. An external interface 202 includes an 8-bit parallel bus and a logic interface. A DAC and low-pass filter block 203 is coupled to a local oscillator 204. The local oscillator 204 is coupled to a clock multiplier 205. An N*LO MHz signal 206 and an N-kHz signal 207 are the outputs of the synchronization module. A dashed box 210 includes all elements that may be external to a clock core. The structure and functionality of each block is similar to the elements illustrated in FIG. 1, now exposed in a generalized form.

Referring to FIGS. 1 and 2, note that the oven controlled crystal oscillator 113 and the local oscillator 204 are tunable oscillators. Tunable designs may have problems as the lower stratum levels bound specifications to conflicting requirements. In fact, it may be preferable to utilize a non-tunable oscillator for better performance and to achieve lower stratum level clock designs. By utilizing a tunable oscillator, the design includes steering an off-frequency clock into a certain frequency by physically pulling the tunable oscillator.

Figure 3:
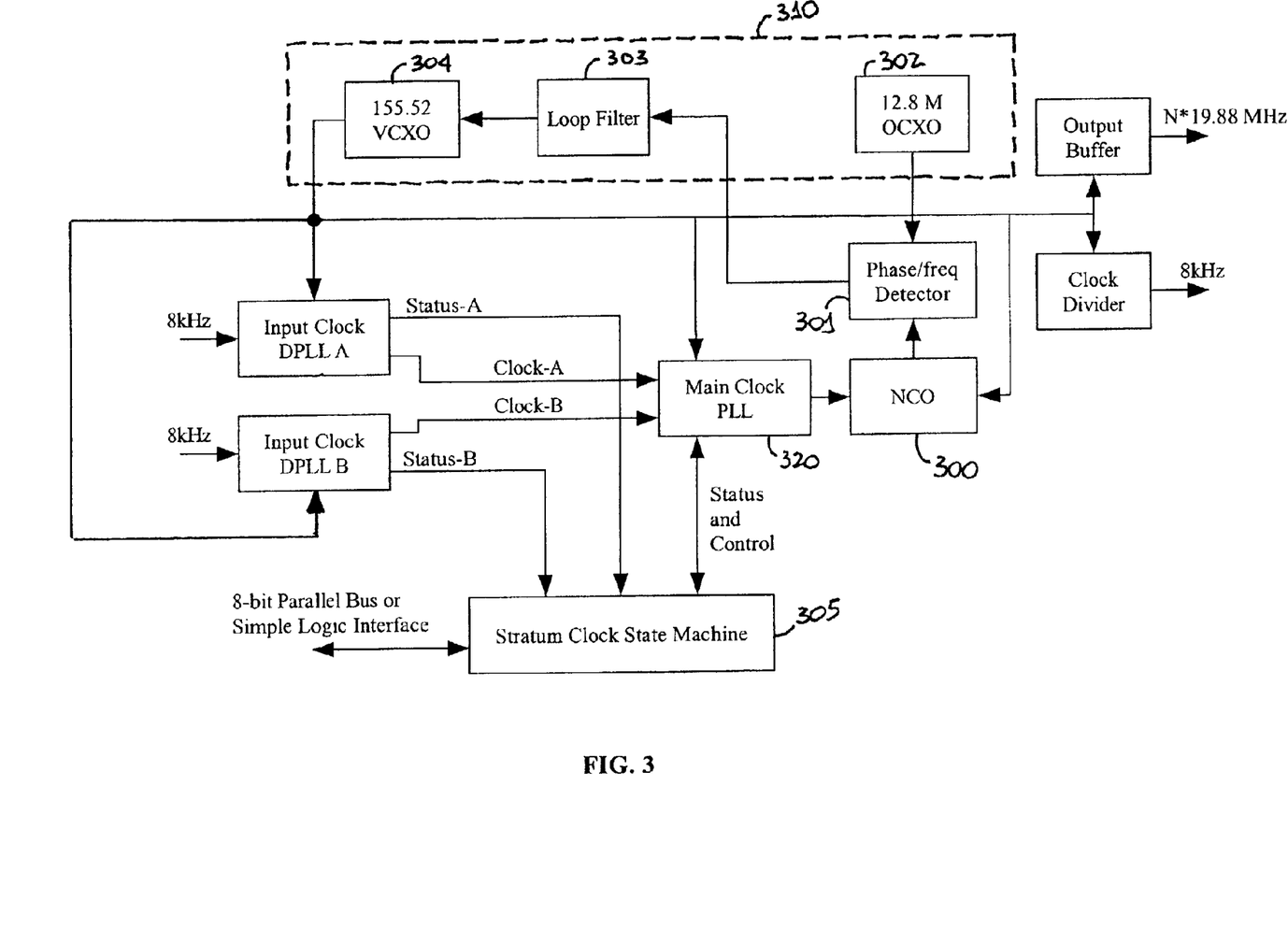
FIG. 3 illustrates a block diagram of an enhanced stratum 3/3E core sync module, representing an embodiment of the invention.

Referring to FIG. 3, a block diagram of an enhanced stratum 3/3E core sync module is depicted, representing a digital implementation of the system depicted in FIG. 1. A numerically controlled oscillator 300 is coupled to a phase/frequency detector 301, to a main clock PLL 320, and to a 155.52 MHz voltage controlled crystal oscillator 304. The phase/frequency detector 301 is coupled to a loop filter 303. The loop filter 303 is coupled to the 155.52 MHz voltage controlled crystal oscillator 304. A 12.8 MHz oven controlled crystal oscillator 302 is coupled to the phase/frequency detector 301. A dashed box 310 includes all elements that may be external to a clock core.

Still referring to FIG. 3, the 12.8 MHz oven controlled oscillator runs free, and a correction signal at the output of the main digitally controlled oscillator 300 can be compared with the 12.8 MHz oven controlled crystal oscillator 302 at the phase/frequency detector 301, and fed into the loop filter 303, which steers the 155.52 MHz voltage controlled oscillator. The numerically controlled oscillator 300 can be a 34-bit numerically controlled oscillator using a conventional adder with feedback and utilizing the most significant bit as the nominal 12.8 MHz output clock. Alternatively, other synthesizer structures such as a pulse swallowing approach may be employed which are more efficient to implement.

Still referring to FIG. 3, in other words, a 155.52 MHz signal can be generated with a known frequency relationship with respect to the 12.8 MHz reference signal 302. The noise that comes from this digital system is filtered inside the loop filter 303, eliminating the need for a direct digital synthesizer block. This frequency relationship can be controlled by the stratum clock state machine 305, and can force the noise to be in a region where the loop filter 303 operates. Also, note that this frequency relationship can be determined utilizing conventional methods such as Monte Carlo simulations.

Still referring to FIG. 3, note that the 12.8 MHz oven controlled crystal oscillator 302 is a fixed (non-tunable) local oscillator. In this design the main clock PLL 320 generates a control word, which represents a measure of how much steering would be needed to get a local oscillator on a certain frequency. Instead of utilizing this measure to tune the local oscillator, the output of the system can be changed to compensate for the difference. For example, if the local oscillator is off by 1 Hz above the expected frequency, the main clock PLL 320 drives the numerically controlled oscillator 300 to be 1 Hz above the nominally center frequency. This signal serves as one of the inputs to the phase/frequency detector 301. The output of the phase/frequency detector 301 is filtered through the low pass filter and will force the voltage control reference oscillator to move 1 Hz lower in frequency with respect to the normal free-running center frequency. The output of the system is therefore compensated.

Figure 4:
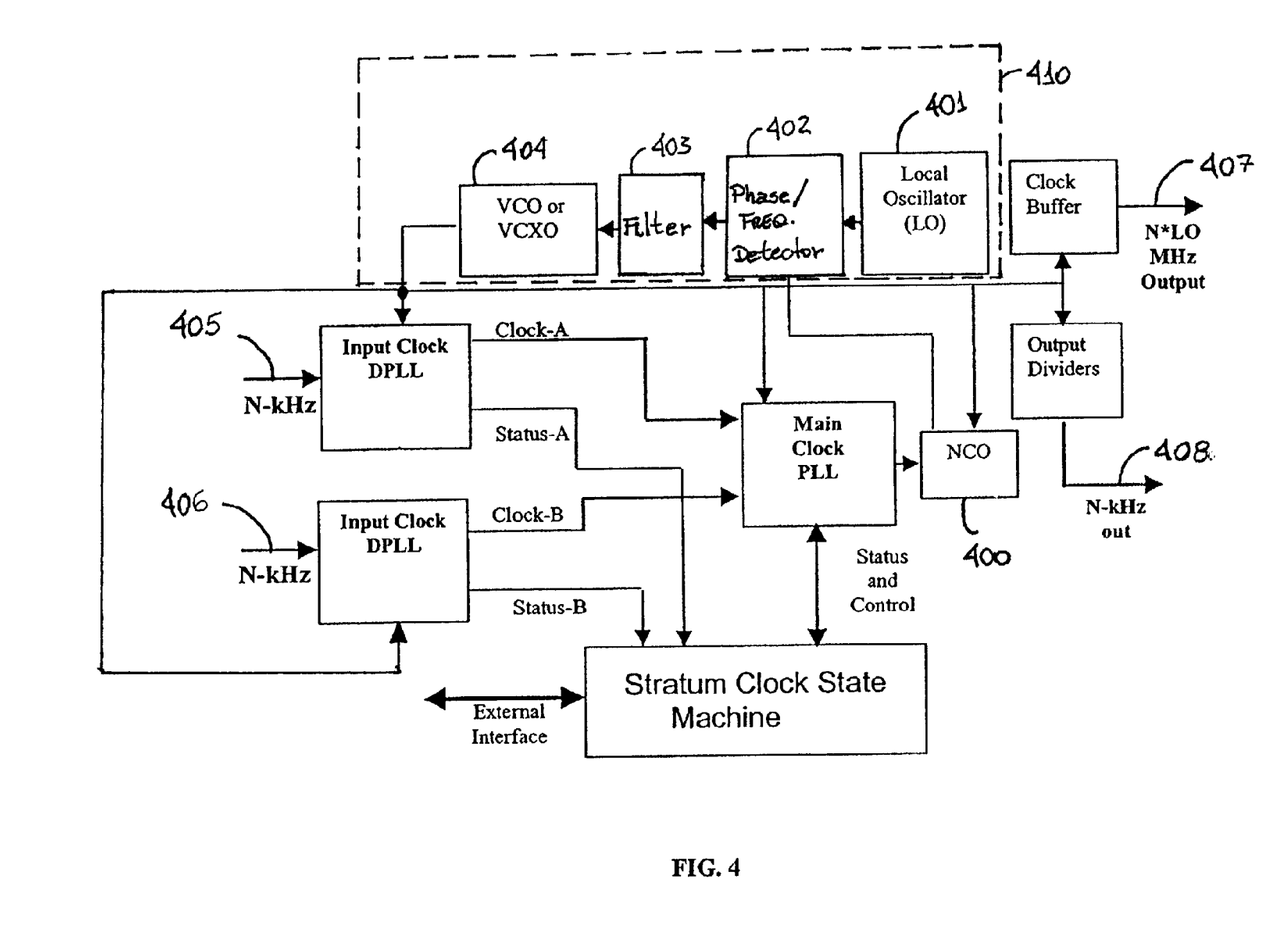
FIG. 4 illustrates a block diagram of a generalized synthesizer based cascaded digital PLL clock, representing an embodiment of the invention.

Referring to FIG. 4, a block diagram of a generalized synthesizer based cascaded digital PLL clock is depicted. A pair N-kHz signals 405, 406 can be the inputs to the synchronization module. An N*LO MHz signal 407 and an N-kHz signal 408 can be the output signals of the synchronization module. The operation of the module and the functionality of each block are similar to the module depicted in FIG. 3, now presented in a generalized form.

Still referring to FIG. 4, a numerically controlled oscillator 400 is coupled to a phase/frequency detector 402. A local oscillator 401 is coupled to the PLL 402. The phase/frequency detector 402 is coupled to a loop filter 403. The loop filter 403 is coupled to a voltage controlled oscillator 404. The output of the voltage controlled oscillator 404 feeds the numerically controlled oscillator 400.

Referring to FIG. 4, the loop filter 403 can be a type 2 proportional integral filter, and it should be sufficiently wide so that it does not have any effect on the overall time constants of the overall loop. One skilled in the art shall design such filter in order to eliminate or attenuate ripples. A dashed box 410 includes all elements that may be external to a clock core.

Figure 5:
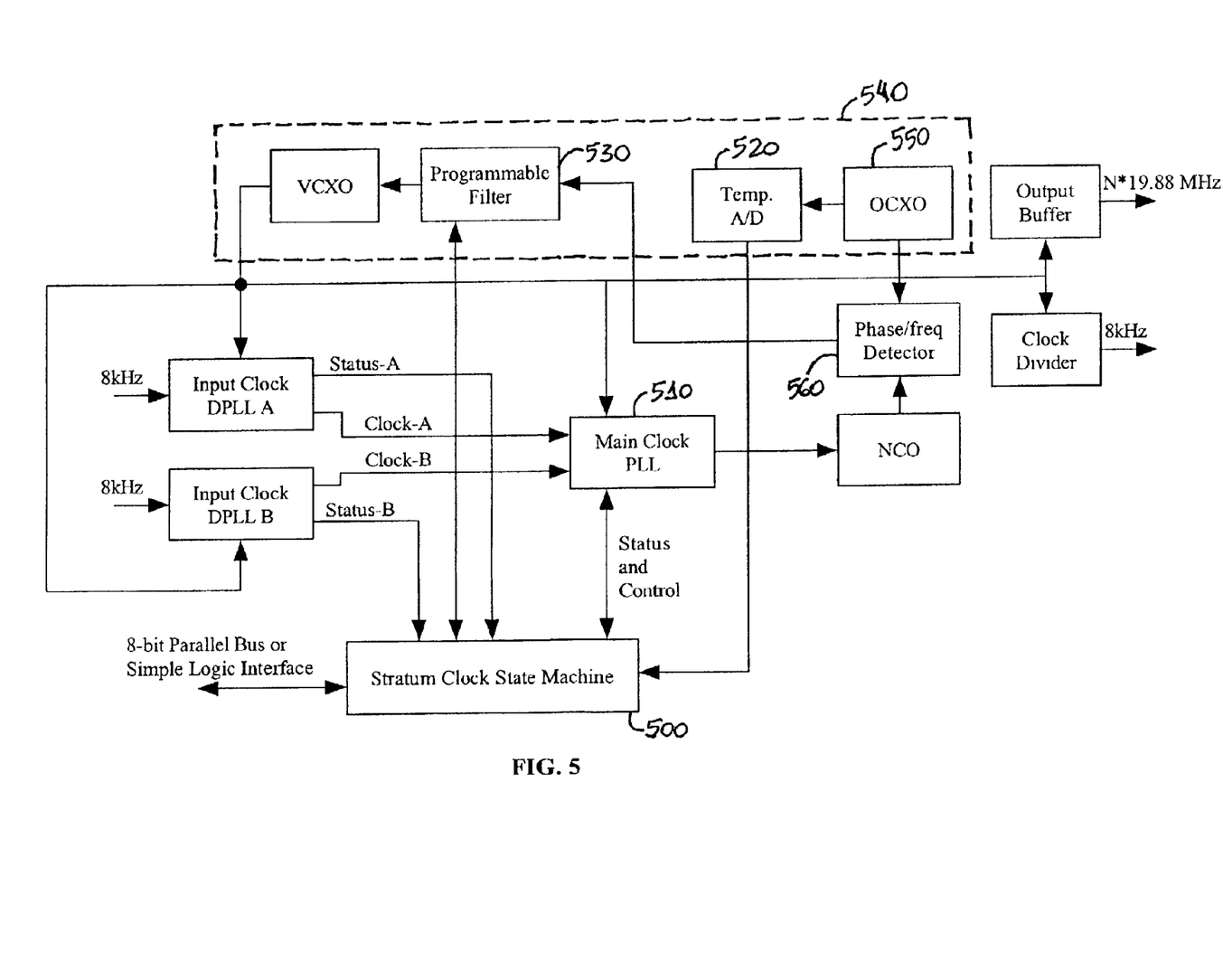
FIG. 5 illustrates a block diagram of a generalized synthesizer based cascaded digital PLL clock with dynamic monitoring, representing an embodiment of the invention.

Referring to FIG. 5, a block diagram of a generalized synthesizer based cascaded digital PLL clock with dynamic monitoring is depicted. A phase/frequency detector 560 is coupled to a programmable filter 530. A stratum clock state machine 500 is coupled to the programmable filter 530. An oven controlled crystal oscillator 550 is coupled to the phase/frequency detector 560 and to an analog to digital converter 520. The analog to digital converter 520 is coupled to the stratum clock state machine 500.

Still referring to FIG. 5, the temperature of the oven controller crystal oscillator 550 can be dynamically probed and converted into a digital measurement by the analog to digital converter 520. This value can be fed into the stratum clock state machine 500 and used for processing. A temperature compensation algorithm may be used by the stratum clock state machine 500 to control the main clock PLL 510. In this design, note that the loop filter has been substituted by the programmable filter 530, which is under control of the stratum clock state machine 500.

The stratum clock state machine is an important part of the invention, and includes the process that manages the phase-locked loops to help eliminate input transients and to induce the phase build-out activities.

Figure 6:
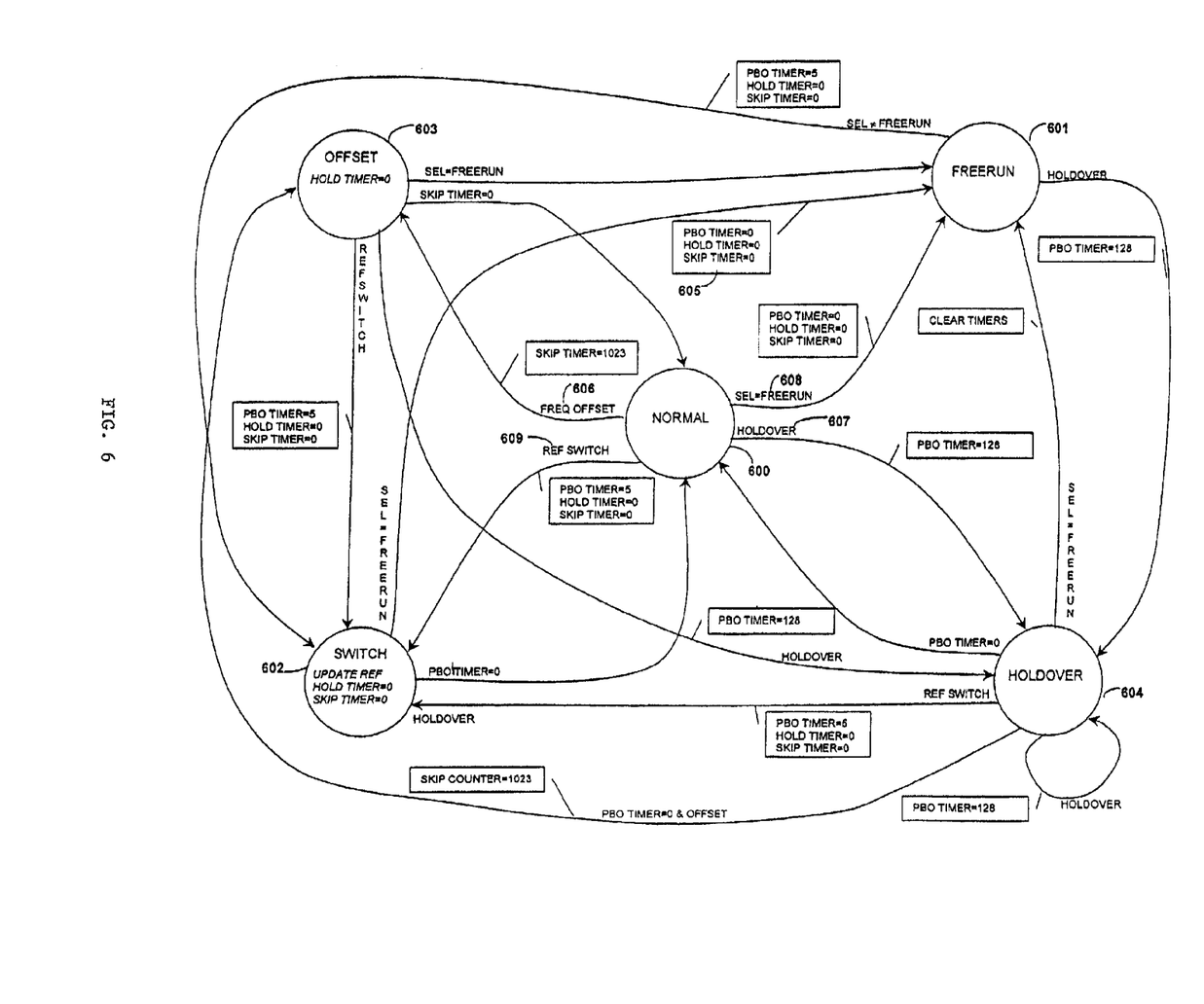
FIG. 6 illustrates a block diagram of a stratum 3 state machine, representing an embodiment of the invention.

Referring to FIG. 6, a block diagram of a stratum 3 state machine is depicted. The update rate for the stratum 3 state machine is 100 mS. There can be five states, including: a normal state 600, a freerun state 601, a switch state 602, an offset state 603 and a holdover state 604.

Referring to FIGS. 1 and 6, the stratum 3 state machine can control a multiplexer which selects the output and control signals from one of the input DPLLs 102, 103. The selected frequency output is used as the input signal to the main clock PLL 110. The control signals from the selected DPLL are used to control the stratum 3 state machine. Based on the control signals, the stratum 3 state machine will select one of the five operating states: normal 600, freerun 601, switch 602, offset 603, or holdover 604.

Referring again to FIG. 6, the stratum 3 state machine can also select either a short or long time constant filter in the main clock PLL. While the main clock PLL is in the holdover state 604 or the switch state 602 the phase buildout function is active. While in the holdover state 604, or the switch state 602 a 25 second frequency history is applied to the frequency synthesizer in the main clock PLL block. At the same time a phase measurement circuit is forced into a zero phase error state by preloading a phase measurement counter with zero on the edge of the input signal.

Still referring to FIG. 6, the stratum clock state machine will be in the normal state 600 when an input is selected and the input is good. It will be in the freerun state 601 when a user selects freerun through a plurality of select pins. The switch state 602 is entered when the user switches input references. When the switch state 602 is entered, the phase buildout is asserted, the input to the main clock PLL is switched to the other input DPLL, and then the phase buildout is de-asserted. The stratum clock state machine can remain in the switch state 602 for 500 ms.

Still referring to FIG. 6, the offset state 603 is entered when a frequency offset is detected on the selected input. The stratum clock state machine will remain in this state until main clock PLL frequency synthesizer has been adjusted. It can remain in this state an additional 12 seconds after the frequency offset signal from the input DPLL has been de-asserted.

Still referring to FIG. 6, the holdover state 604 is entered when an error is detected on the selected input or the user selects holdover form the select pins. In the holdover state 604, the phase buildout is asserted and the 25 second frequency history is applied to the main clock PLL frequency synthesizer. The stratum clock state machine will remain in the holdover 12 seconds after all the input monitor signals have been de-asserted.

Still referring to FIG. 6, three timers 605 are set by the state machine input events and decremented every 100 mS. The timers can simply be loadable down counters that are stopped at the zero count. They are cleared when a reference switch is detected. When a PBO timer (timer for asserting phase buildout, 25 sec history) is non-zero, the 25 second frequency history is applied to the frequency synthesizer in the main clock PLL block. Also the phase measurement process in the main clock PLL is forced to zero phase. The update of the 25 second history is also inhibited. When the phase noise detector in the input clock DPLL is tripped, a HOLD timer is set to 128. When the HOLD timer (timer for selection of long time constant filter) is non-zero a longer time constant filter is selected in the main clock PLL to provide better filtering. As long as the phase noise detector output is asserted, the counter will be constantly loaded. When a reference frequency offset is detected, a SKIP timer (timer to prevent PBO while tracking frequency offset) is loaded. When the SKIP timer is non-zero the phase buildout process is prevented. This allows the main clock PLL to adjust its frequency without a phase buildout occurring.

Still referring to FIG. 6, a SEL(1:0) input to the stratum clock state machine is supplied by two pins on the sync module. These inputs allow the user to select one of the modes: freerun mode 00, select reference A 01, select reference B 10, and select holdover 11. The inputs to the stratum clock state machine can include a strobe_100 mS signal, which is a 100 mS tick that updates state machine.

Still referring to FIG. 6, the inputs to the stratum clock state machine can also include a frequency offset signal 606 (frequency in selected input DPLL>2.4 PPM off). The frequency offset signal is produced by each of the input DPLLs. It is asserted when the measured input frequency is greater than 2.4 parts per million. This signal can cause the state machine to enter the offset state 603 for 100 seconds while the main PLL is allowed to adjust. While in this state, phase buildout is prevented.

Still referring to FIG. 6, the inputs to the stratum clock state machine can also include a frequency error signal (frequency in selected input DPLL>14.4 PPM off). The frequency error signal is generated by each of the input DPLLs. It is asserted when the measured input frequency is greater than 14.4 PPM. This is an input error situation and forces the state machine into the holdover state 604 where a 25 second history value is applied to the frequency synthesizer in the main clock PLL.

Still referring to FIG. 6, the inputs to the stratum clock state machine can also include a phase step signal (Phase step>1.4 uS detected in selected input DPLL). The phase step signal is generated by each of the input DPLLs. It is asserted when a phase step greater than 1.4 uS is detected. Under these conditions, the phase step is eliminated on the output. The state machine enters the holdover state for 12 seconds where the phase buildout function is performed.

Still referring to FIG. 6, the inputs to the stratum clock state machine can also include a phase noise signal (Phase noise detected in selected input DPLL). The phase noise signal is generated by each of the input DPLLs. It is asserted when excessive phase noise is detected on an input. Under these conditions a 12 second timer is set and a longer time constant is selected in the main PLL.

Still referring to FIG. 6, the combined signals for the stratum clock state machine can include a holdover signal 607 (SEL=11 or frequency error). The holdover signal is selected by the user from the SEL pins of the module, by the detection of a large phase step on the selected input or by an input frequency that is more than 14.4 parts per million off frequency.

Still referring to FIG. 6, the combined signals for the stratum clock state machine can include a freerun signal 608 (SEL=00). Freerun is selected by the user through the SEL pins on the module. It can also include a refswitch signal 609 (detection SEL transition between RefA and RefB). The reference switch signal is asserted when the user switches input references through the SEL pins of the module. When a reference switch is detected, all timers are reset and the state machine enters the Switch state.

Still referring to FIG. 6, the stratum clock state machine outputs include: refsel, PBO, freerun and MPLL_hold. Refsel selects one of the two reference inputs. The state machine only allows this signal to toggle while the phase buildout is asserted in the switch state 602. By asserting the phase buildout, the phase between the two inputs will not appear on the output clock. The PBO output zeros out the main clock phase detector and applies a 25 second frequency history to the main clock synthesizer. This eliminates phase steps on the output when switching references, or if a phase step occurs on a selected input. The freerun output selects freerun mode which uses the uncorrected local oscillator to derive the output frequency. Reference inputs are ignored. The MPLL_hold output selects the filter parameters in the main clock block.

The context of the invention can include communication systems. More particularly, the invention includes the synchronization of wireless and wireline communication systems. The context of the invention can also include a cascaded digital PLL-based clock design.

The invention can also be included in a kit. The kit can include some, or all, of the components that compose the invention. The kit can be an in-the-field retrofit kit to improve existing systems that are capable of incorporating the invention. The kit can include software, firmware and/or hardware for carrying out the invention. The kit can also contain instructions for practicing the invention. Unless otherwise specified, the components, software, firmware, hardware and/or instructions of the kit can be the same as those used in the invention.

The term coupled, as used herein, is defined as connected, although not necessarily directly, and not necessarily mechanically. The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system. The terms including and/or having, as used herein, are defined as comprising (i.e., open language). The terms a or an, as used herein, are defined as one or more than one. The term another, as used herein, is defined as at least a second or more.

Practical Applications of the Invention

A practical application of the invention that has value within the technological arts is synchronization of communication systems. Specifically, a preferred implementation of the invention relates to a cascaded digital PLL-based clock design. Further, the invention is useful in conjunction with digital communication networks are used for the purpose of synchronization, or the like. There are virtually innumerable uses for the invention, all of which need not be detailed here.

Advantages of the Invention

A core synchronization module, representing an embodiment of the invention, can be cost effective and advantageous for at least the following reasons. The invention improves quality and/or reduces costs compared to previous approaches.

All the disclosed embodiments of the invention disclosed herein can be made and used without undue experimentation in light of the disclosure. Although the best mode of carrying out the invention contemplated by the inventors is disclosed, practice of the invention is not limited thereto. Accordingly, it will be appreciated by those skilled in the art that the invention may be practiced otherwise than as specifically described herein.

Further, the individual components need not be combined in the disclosed configurations, but could be combined in virtually any configuration. Further, variation may be made in the steps or in the sequence of steps composing methods described herein.

Further, although the core synchronization module described herein can be a separate module, it will be manifest that the core synchronization module may be integrated into the system with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES

[1] Near et al., Method for Synchronizing Interconnected Digital Equipment, U.S. Pat. No. 5,068,877.
[2] Wolf, Clock Generator and Synchronizing Method, U.S. Pat. No. 6,181,175.
[3] Telcordia GR1244.
[4] The Electrical Engineering Handbook, CRC Press, (Richard C. Dorf et al. eds.), 1993.

What is claimed is:

1. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal;
utilizing the stratum clock state machine to set the main clock to a main clock holdover state; and
applying a frequency history to a frequency synthesizer in the main clock wherein applying the frequency history includes applying an approximately twenty-five second frequency history.

2. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal;
utilizing the stratum clock state machine to set the main clock to a main clock holdover state;
applying a frequency history to a frequency synthesizer in the main clock; and forcing a phase measurement circuit into a zero phase error state by preloading a phase measurement counter with a zero substantially on an edge of an input signal.

3. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
utilizing the stratum clock state machine to select a short time constant filter in the main clock.

4. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
utilizing the stratum clock state machine to select a long time constant filter in the main clock.

5. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
utilizing the stratum clock state machine to select a programmable filter.

6. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal;
providing the stratum clock state machine with a user selection input, wherein the user selection input includes at least one member selected from the group consisting of: a select freerun mode, a select reference A mode, a select reference B mode and a select holdover mode utilizing the stratum clock state machine to select a programmable filter.

7. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
providing the stratum clock state machine with a frequency offset input including:
receiving a frequency offset signal produced by each of a pair of input digital
phase-locked loops; and
measuring the frequency offset signal.

8. The method of claim 7, further comprising setting the stratum clock state machine to the stratum clock state machine offset state if a measured frequency offset signal is greater than approximately 2.4 parts per million.

9. The method of claim 8, further comprising maintaining the stratum clock state machine offset state for approximately an additional 12 seconds after the measured frequency offset signal is de-asserted.

10. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
providing the stratum clock state machine with a frequency error input including:
receiving a frequency error signal produced by each of the pair of input digital
phase-locked loops; and
measuring the frequency error signal.

11. The method of claim 10, further comprising setting the stratum clock state machine to a stratum clock state machine holdover state if a measured frequency error signal is greater than approximately 14.4 parts per million.

12. The method of claim 11, further comprising applying an approximately twenty-five second frequency history to the frequency synthesizer in the main clock.

13. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
providing the stratum clock state machine with a phase step input including:
receiving a phase step signal produced by each of the pair of input digital phase-locked
loops; and
measuring the phase step signal.

14. The method of claim 13, further comprising setting the stratum clock state machine to the stratum clock state machine holdover state if a measured phase step signal is greater than approximately 1.4 microseconds.

15. The method of claim 14, further comprising performing a phase buildout function for approximately 12 seconds.

16. A method, comprising:
receiving a pair of input clock signals;
utilizing a stratum clock state machine to control a multiplexer;
utilizing the multiplexer to switch an input of a main clock between each of the pair of input clock signals;
inducing a phase build-out activity;
transmitting an output clock signal; and
providing a set of three timers, wherein each timer is set by a state machine input event, including: a phase buildout timer, a hold timer, and a skip timer.

17. The method of claim 16, further comprising clearing the set of three timers when a reference switch is detected.

* * * * *